(12) United States Patent
Jung et al.

(10) Patent No.: US 10,080,281 B2
(45) Date of Patent: Sep. 18, 2018

(54) DISPLAY APPARATUS AND METHOD FOR MANUFACTURING THE SAME

(71) Applicant: SAMSUNG DISPLAY CO., LTD., Yongin-si, Gyeonggi-do (KR)

(72) Inventors: Younhwan Jung, Hwaseong-si (KR); Minseop Kim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 155 days.

(21) Appl. No.: 14/941,444

(22) Filed: Nov. 13, 2015

(65) Prior Publication Data
US 2016/0219723 A1     Jul. 28, 2016

(30) Foreign Application Priority Data

Jan. 26, 2015   (KR) .......................... 10-2015-0012287

(51) Int. Cl.
*H05K 1/02*     (2006.01)
*G02F 1/13*     (2006.01)
(Continued)

(52) U.S. Cl.
CPC ......... *H05K 1/028* (2013.01); *G02F 1/13452* (2013.01); *H01L 51/0097* (2013.01);
(Continued)

(58) Field of Classification Search
CPC .................. H05K 1/028; H05K 1/147; H05K 2201/10128; G02F 1/13; H01L 51/0097;
(Continued)

(56) References Cited

U.S. PATENT DOCUMENTS

| 7,906,896 B2 * | 3/2011 | Seo ........................ H01L 51/529 313/498 |
| 2013/0293816 A1 * | 11/2013 | Jung ................. H01L 23/49827 349/139 |
| 2015/0036300 A1 * | 2/2015 | Park ....................... H05K 1/147 361/749 |

FOREIGN PATENT DOCUMENTS

| JP | 4645074 B2 | 3/2011 |
| KR | 10-2007-0121164 A | 12/2007 |

(Continued)

OTHER PUBLICATIONS

European Patent Office Abstract Publication No. JP 2006-010931 A, dated Jan. 12, 2006, for JP 4645074 B2, 2 pages.
(Continued)

*Primary Examiner* — Michael P McFadden
(74) *Attorney, Agent, or Firm* — Lewis Roca Rothgerber Christie LLP

(57) ABSTRACT

A display apparatus includes a display panel, a panel adhesive film on the display panel, a main printed circuit board, and a flexible printed circuit board. The main printed circuit board is adhered to the panel adhesive film in an assembled state. The flexible printed circuit board electrically connects the display panel to the main printed circuit board. The flexible printed circuit board includes a base film, an integrated circuit chip, and a FPCB adhesive film. The base film has a bonding area that is bonded to the display panel and the main printed circuit board and a non-bonding area that is not bonded to the display panel and the main printed circuit board. The FPCB adhesive film is on the base film and overlaps with the non-bonding area. The FPCB adhesive film and the panel adhesive film are adhered to each other in the assembled state.

10 Claims, 8 Drawing Sheets

(51) Int. Cl.
*H05K 1/14* (2006.01)
*H01L 51/00* (2006.01)
*G02F 1/1345* (2006.01)

(52) U.S. Cl.
CPC ......... *H05K 1/147* (2013.01); *G02F 2202/28* (2013.01); *H01L 2251/5338* (2013.01); *H05K 2201/10128* (2013.01); *Y02E 10/549* (2013.01); *Y02P 70/521* (2015.11)

(58) Field of Classification Search
CPC ........... H01L 2251/5338; Y02P 70/521; Y02E 10/549
USPC ........................................................ 361/749
See application file for complete search history.

(56) References Cited

FOREIGN PATENT DOCUMENTS

| | | |
|---|---|---|
| KR | 10-2013-0015789 A | 2/2013 |
| KR | 10-2013-0088102 A | 8/2013 |
| KR | 10-1460709 B1 | 11/2014 |

OTHER PUBLICATIONS

European Patent Office Abstract Publication No. KR 2013-0097497 A, dated Sep. 3, 2013, for KR 10-1460709 B1, 1 page.

\* cited by examiner

DISPLAY APPARATUS AND METHOD FOR MANUFACTURING THE SAME

CROSS-REFERENCE TO RELATED APPLICATION

This application claims priority to and the benefit of Korean Patent Application No. 10-2015-0012287, filed on Jan. 26, 2015, the entire contents of which are hereby incorporated by reference.

BACKGROUND

The present disclosure relates to a display apparatus and a method for manufacturing the same.

A display apparatus includes a display panel, a printed circuit board for driving the display panel, and a tape carrier package (TCP) or chip on film (COF) package, which electrically connects the display panel to the printed circuit board.

The COF package is increasing in use because it has a relatively low coefficient of thermal expansion and excellent flexibility, uses a thinner thin film, and realizes a fine pitch in comparison with the TCP.

The COF package has one end attached to an upper portion of the display panel and is curved to be mounted on a lower portion of the display panel. Because a restoring force acts on the COF package in a direction opposite to the curved direction of the COF package when the COF package is in an assembled state, a peel-off phenomenon in which the COF package peels away from the lower portion of the display panel over time may occur.

SUMMARY

The present disclosure provides a display apparatus having a structure in which a flexible printed circuit board is firmly fixed to a display panel to prevent or minimize the likelihood of a peel-off phenomenon from occurring and a method for manufacturing the same.

According to one or more exemplary embodiments of the present invention, a display apparatus includes: a display panel for displaying an image; a panel adhesive film on the display panel; a main printed circuit board having circuits for driving the display panel thereon, the main printed circuit board being adhered to the panel adhesive film in an assembled state; and a flexible printed circuit board electrically connecting the display panel to the main printed circuit board, wherein the flexible printed circuit board includes: a base film having a bonding area that is bonded to the display panel and the main printed circuit board and a non-bonding area that is not bonded to the display panel and the main printed circuit board; an integrated circuit chip on the base film and overlapping with the non-bonding area; and an FPCB adhesive film on the base film and overlapping with the non-bonding area, the FPCB adhesive film and the panel adhesive film being adhered to each other in the assembled state.

In some embodiments, FPCB adhesive film may surround the integrated circuit chip in a plane.

In some embodiments, the panel adhesive film may include a first panel adhesive film adhered to the flexible printed circuit board and a second panel adhesive film adhered to the main printed circuit board.

In still other embodiments, the first panel adhesive film may have an area that is substantially the same as that within an outer periphery of the FPCB adhesive film in a plan view.

In some embodiments, the first panel adhesive film may overlap with the integrated circuit chip in the assembled state.

In some embodiments, the first panel adhesive film may have substantially the same shape as the FPCB adhesive film in a plan view.

In some embodiments, the first panel adhesive film and the integrated circuit chip may not overlap in the assembled state.

In some embodiments, the display apparatus may further include a cover panel between the display panel and the panel adhesive film to protect the display panel from an external shock.

In some embodiments, the cover panel may include a porous material.

In some embodiments, the cover panel may include at least one of polyurethane, polyethylene, and polyacryl.

In some embodiments, the display panel may be flexible.

In some embodiments, the display panel may be an organic light emitting display panel.

In one or more exemplary embodiments of the present invention, a method for manufacturing a display apparatus includes: providing a display module including: a display panel, a flexible printed circuit board, and a main printed circuit board, a first end of the flexible printed circuit board being bonded to the display panel and a second end of the flexible printed circuit board being bonded to the main printed circuit board; forming a panel adhesive film on a first surface of a cover panel; attaching a second surface of the cover panel to the display panel after a first amount of time elapses after the panel adhesive film is formed on the first surface of the cover panel; and bending the flexible printed circuit board to adhere the flexible printed circuit board to the panel adhesive film.

In some embodiments, the first amount of time may be five days or more.

In some embodiments, the flexible printed circuit board may include: a base film having a bonding area that is bonded to the display panel and the main printed circuit board and a non-bonding area that is not bonded to the display panel and the main printed circuit board; an integrated circuit chip on the base film and overlapping with the non-bonding area; and a FPCB adhesive film on the base film and overlapping with the non-bonding area, wherein the bending of the flexible printed circuit board to adhere the flexible printed circuit board to the panel adhesive film includes allowing the FPCB adhesive film to adhere to the panel adhesive film.

BRIEF DESCRIPTION OF THE DRAWINGS

The accompanying drawings are included to provide further understanding of the inventive concept, and are incorporated in and constitute a part of this specification. The drawings illustrate exemplary embodiments of the present inventive concept and, together with the description, serve to explain principles of the present inventive concept. In the drawings.

DETAILED DESCRIPTION

Figure 1:
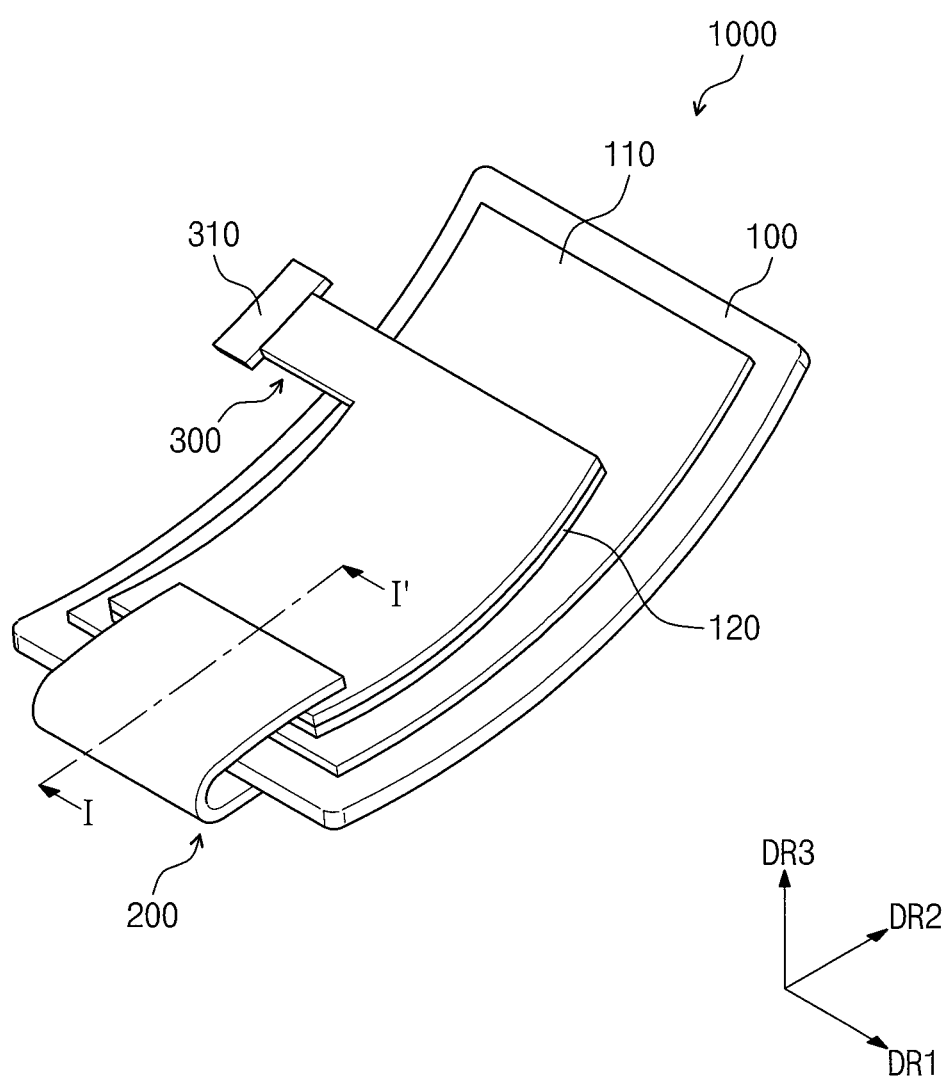
FIG. 1 is a perspective view of a display apparatus in an assembled state according to one or more exemplary embodiments of the present invention.

Hereinafter, specific embodiments are described with reference to the accompanying drawings. The present disclosure may, however, be embodied in different forms and various modifications and variations can be made in the present disclosure. The present disclosure should not be construed as being limited to the embodiments set forth herein and should be understood to be intended to include the structural and functional equivalents of the matter disclosed herein.

It will be understood that although the terms "first," "second," etc. may be used herein to describe various components, these components should not be limited by these terms. These components are only used to distinguish one component from another. As used herein, the singular forms "a," and "an" are intended to include the plural forms as well, unless the context clearly indicates otherwise. It will be further understood that the terms "comprises," "comprising," "includes," and/or "including" used herein specify the presence of stated features or components, but do not preclude the presence or addition of one or more other features or components. The use of "may" when describing embodiments of the present invention refers to "one or more embodiments of the present invention." Also, the term "exemplary" is intended to refer to an example or illustration. Expressions such as "at least one of," when preceding a list of elements, may modify the entire list of elements and may not modify the individual elements of the list.

Sizes of elements in the drawings may be exaggerated for convenience of explanation. In other words, because sizes and thicknesses of components in the drawings are arbitrarily illustrated for convenience of explanation, the following embodiments are not limited thereto. Spatially relative terms, such as "below," "lower," "bottom," "above," "upper," "top," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" other elements or features would then be oriented "above" the other elements or features. Thus, the example term "below" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on" or "connected to" another element or layer, it can be directly on or directly connected to the other element or layer, or one or more intervening elements or layers may also be present. In addition, it will also be understood that when an element or layer is referred to as being "between" two elements or layers, it can be the only element or layer between the two elements or layers, or one or more intervening elements or layers may also be present.

Figure 2:
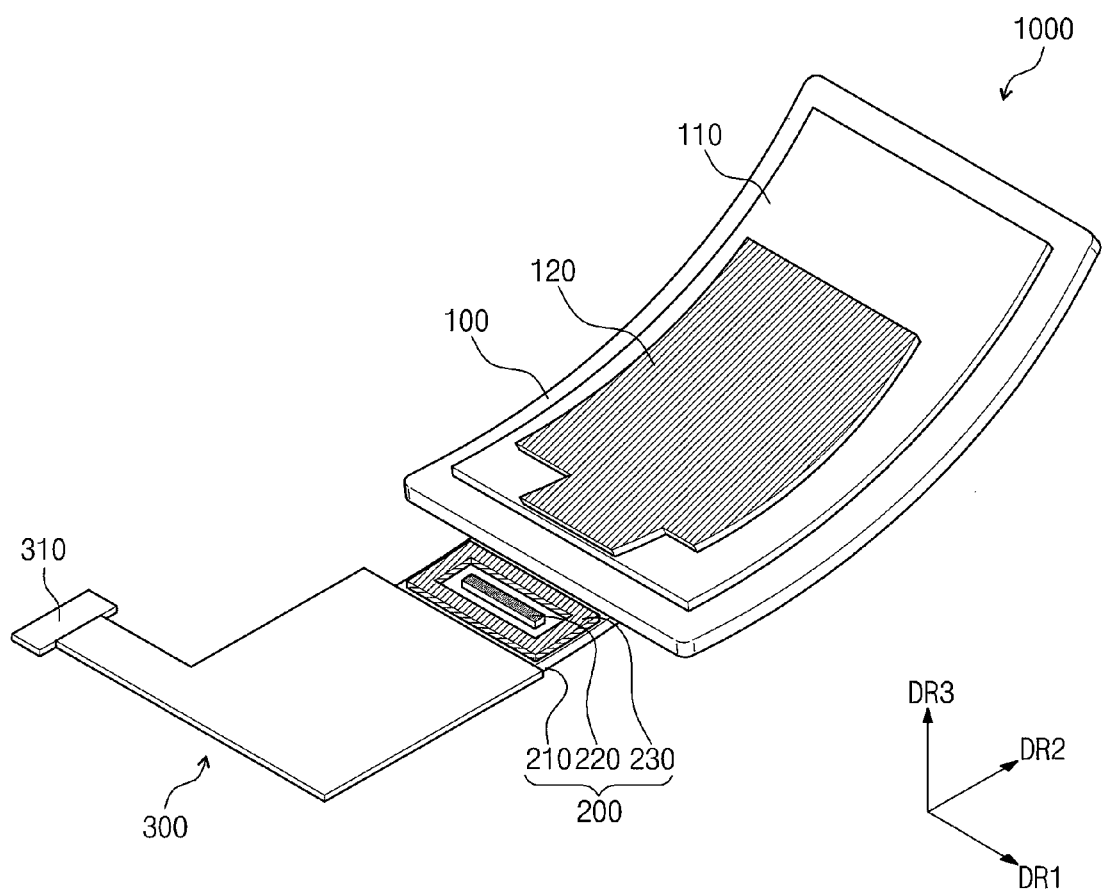
FIG. 2 is a perspective view illustrating the display apparatus of FIG. 1 in an unfolded state.
Figure 3:
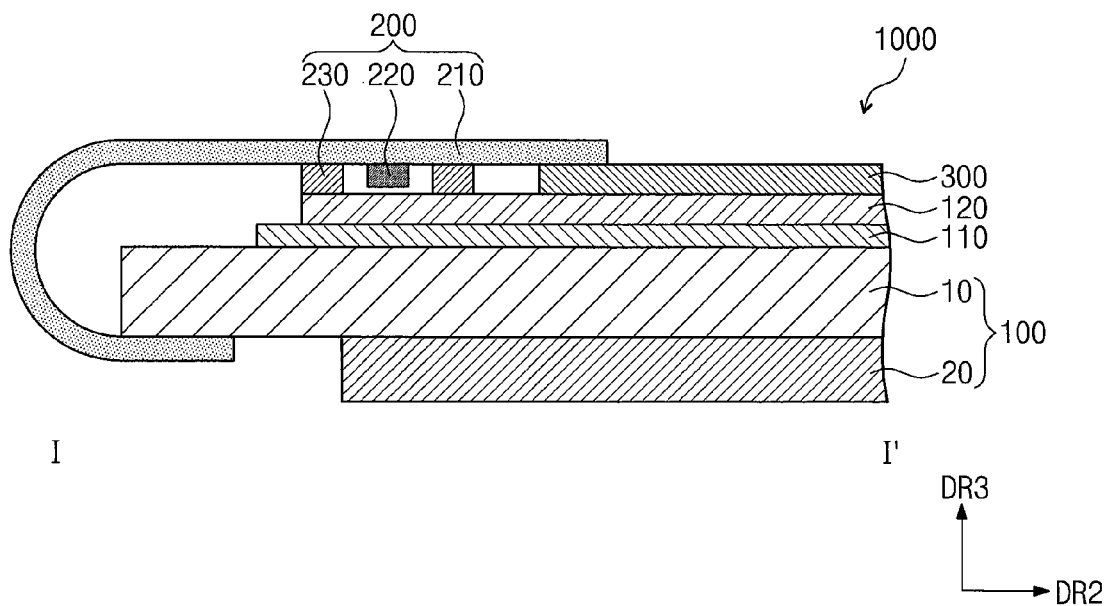
FIG. 3 is a cross-sectional view taken along the line I-I' of FIG. 1.

FIG. 1 is a perspective view of a display apparatus 1000 in an assembled state according to one or more embodiments of the present invention, FIG. 2 is a perspective view of the display apparatus 1000 of FIG. 1 in an unfolded (or pre-assembled) state, and FIG. 3 is a cross-sectional view of the display apparatus 1000 taken along the line I-I' of FIG. 1 of the display apparatus 1000.

Referring to FIGS. 1 and 2, the display apparatus 1000 includes a display panel 100, a flexible printed circuit board (also referred to herein as a FPCB) 200, and a main printed circuit board 300.

The display panel 100 may, for example, include various types of display panels, such as an organic light emitting display panel, a liquid crystal display panel, a plasma display panel, an electrophoretic display panel, and an electrowetting display panel. However, for ease of description, the following description is made with reference to embodiments where the display panel 100 is an organic light emitting display panel.

The display panel 100 displays an image (i.e., is configured to display an image). In FIGS. 1 to 3, the display panel 100 may have a rectangular shape in a plan view. Here, a short side direction may be defined in a first direction DR1, a long side direction may be defined in a second direction DR2, and a thickness direction may be defined in a third direction DR3.

The display panel 100 may be flexible. The curved display panel 100 is illustrated in FIGS. 1 and 2.

The display panel 100 includes a first substrate 10 and a second substrate 20. The first substrate 10 includes a plurality of gate lines, a plurality of data lines, and a plurality of pixels arranged in a matrix form by the gate lines and data lines. Each of the plurality of pixels includes a thin film transistor and an organic light emitting diode.

The thin film transistor may be connected to a corresponding gate line and a corresponding data line. The organic light emitting diode may include an organic light emitting material stacked between an anode and a cathode.

The first substrate 10 may have an area that is larger than an area of the second substrate 20 on the plane. A pad electrode may be disposed on a portion of the first substrate that does not overlap the second substrate 20. The pad electrode is bonded to the flexible printed circuit board 200 and electrically connected to the flexible printed circuit board 200. Signals outputted from the flexible printed circuit board 200 and the printed circuit board 300 are transmitted to the display panel 100 through the pad electrode.

The second substrate 20 is bonded to the first substrate 10 to protect the first substrate 10 from the outside (e.g., to protect the first substrate 10 from outside elements). The second substrate 20 may seal the pixels, the gate lines, and the data lines, which are disposed on the first substrate 10, from the outside. The display panel 100 may further include a polarizing film attached to a surface of the second substrate 20 to prevent light from being reflected to the outside.

According to one or more exemplary embodiments of the present invention, the display panel 100 may output an image from the first substrate 10 toward the second substrate 20.

Figure 4:
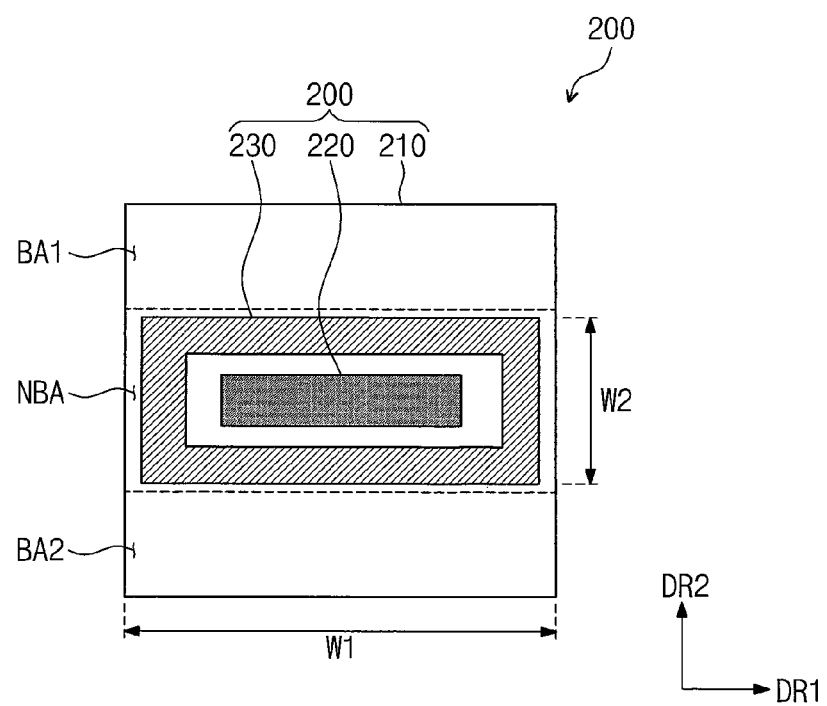
FIG. 4 is a plan view of a flexible printed circuit board according to one or more exemplary embodiments of the present invention.

FIG. 4 is a plan view of the flexible printed circuit board 200 of FIGS. 1 to 3.

Referring to FIGS. 1 to 4, the flexible printed circuit board 200 electrically connects the display panel 100 to the main printed circuit board 300. The flexible printed circuit board 200 may include a base film 210, an integrated circuit chip 220, and an FPCB adhesive film 230.

The base film 210 may include a bonding area and a non-bonding area. The bonding area may include a first bonding area BA1 bonded to the display panel 100 and a second bonding area BA2 bonded to the main printed circuit board 300. The non-bonding area NBA is not bonded to the display panel 100 or to the main printed circuit board 300. The non-bonding area NBA may be disposed between the first bonding area BA1 and the second boding area BA2 in the second direction DR2.

The integrated circuit chip 220 may be mounted on the base film 210 and may overlap with the non-bonding area NBA.

The FPCB adhesive film 230 may be disposed on the base film 210 and may overlap with the non-bonding area NBA. The FPCB adhesive film 230 may surround or substantially surround the integrated circuit chip 220 in a plane. The FPCB adhesive film 230 may fix the base film 210 to the display panel 100.

The flexible printed circuit board 200 may further include a wiring layer and a protection layer, which are disposed between the base film 210 and the FPCB adhesive film 230.

The flexible printed circuit board 200 may be bonded to the pad electrode through the first bonding area BA1 and electrically connected to the display panel 100. The flexible printed circuit board 200 may be bonded to the main printed circuit board 300 through the second bonding area BA2 and electrically connected to the main printed circuit board 300.

Although one flexible printed circuit board 200 is illustrated as an example in FIGS. 1 and 2, the present disclosure is not limited thereto. For example, a plurality of flexible printed circuit boards 200 may be provided.

The flexible printed circuit board 200 may be attached to the display panel 100 such that the flexible printed circuit board 200 is curved in a "C" shape (e.g., a "C"-like shape) in an assembled state. The flexible printed circuit board 200 may extend from a top surface of the first substrate 10 along a side surface of the first substrate 10 and may be fixed on a bottom surface of the first substrate 10. Accordingly, the flexible printed circuit board 200 may be flexible.

The main printed circuit board 300 drives the display panel 100. The main printed circuit board 300 may include a driving board and a plurality of circuit components mounted on the driving board. The main printed circuit board 300 may be fixed to the bottom surface of the first substrate 10 in the assembled state. The main printed circuit board 300 may include a connector 310 for receiving an outside signal.

The display apparatus 1000 may further include a cover panel 110 and a panel adhesive film 120.

The cover panel 110 may be disposed on a bottom surface of the display panel 100. The cover panel 110 may be disposed between the first substrate 10 and the main printed circuit board 300 in the assembled state. The cover panel 110 may absorb a shock that is transferred from a lower portion of the display panel 100 to the display panel 100.

The cover panel 110 may have a porous structure. The cover panel 110 may include at least one of polyurethane, polyethylene, and polyacryl.

The panel adhesive film 120 may be disposed on the cover panel 110. The panel adhesive film 120 and the first substrate 10 may be disposed to face each other with the cover panel 110 disposed therebetween. The panel adhesive film 120 and the FPCB adhesive film 230 may overlap each other when the display apparatus 1000 is in the assembled state. Also, the panel adhesive film 120 and the main printed circuit board 300 may overlap each other in the assembled state. The panel adhesive film 120 may have the same or substantially the same material as the FPCB adhesive film 130.

Figure 5:
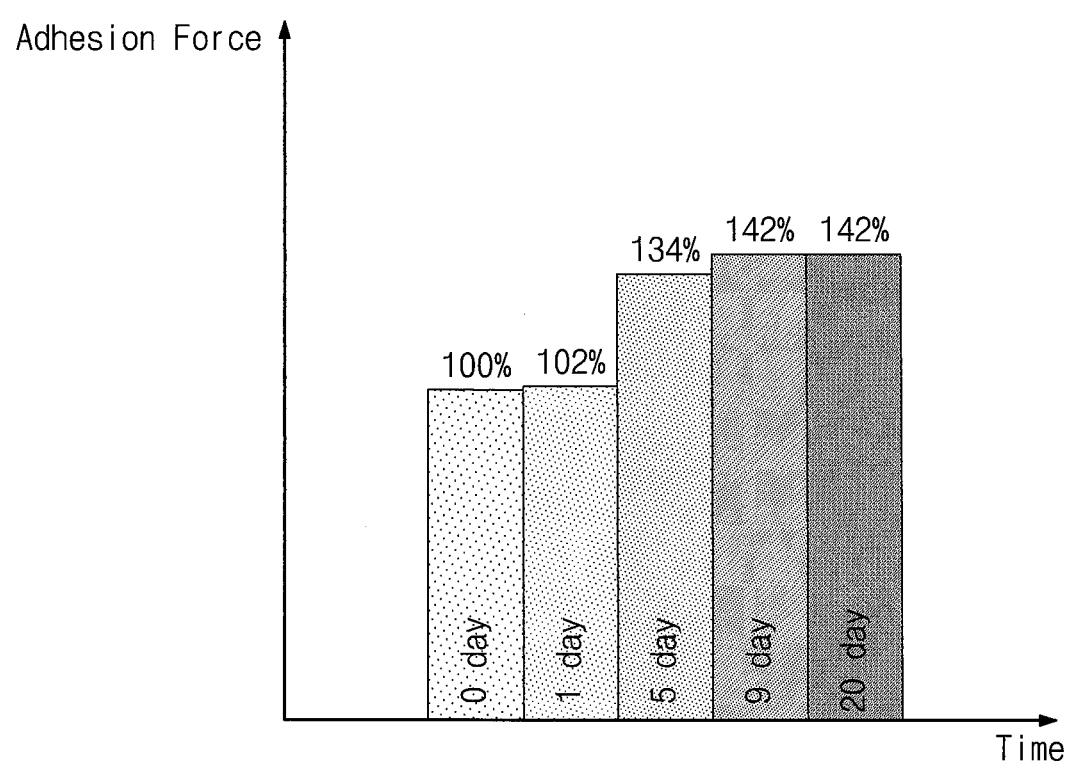
FIG. 5 is a graph illustrating a time-varying adhesion force of a panel adhesive film of the display apparatus of FIG. 1.

FIG. 5 is a graph illustrating a time-varying adhesion force of the panel adhesive film of FIG. 1. Effects of the display apparatus according to an embodiment of the inventive concept will be described with reference to FIGS. 1 to 3 and 5.

Because the flexible printed circuit board 200 is curved in an assembled state, a restoring force by which the flexible printed circuit board 200 is detached from the cover panel 110 acts on the flexible printed circuit board 200. In a comparative example in which a panel adhesive film does not adhere to the FPCB adhesive film because the panel adhesive film does not overlap the FPCB adhesive film, a peel-off phenomenon may occur between a cover panel and the FPCB adhesive film.

According to the display apparatus 1000 according to one or more embodiments of the present invention, the flexible printed circuit board 200 may be firmly fixed because the panel adhesive film 120 adheres to the main printed circuit board 300 as well as the FPCB adhesive film 230.

When some time (e.g., a predetermined amount of time) elapses after the panel adhesive film 120 is disposed on the cover panel 110, an adhesion force between the panel adhesive film 120 and the cover panel 110 may increase. For example, referring to FIG. 5, when nine days have passed after the panel adhesive film 120 is disposed on the cover panel 110, the adhesion force may increase by about 42% relative to an adhesion force at the time of disposing the panel adhesive film 120 on the cover panel 110. Similarly, when some time (e.g., a predetermined amount of time) elapses after the FPCB adhesive film 230 is disposed on the base film 210 of the flexible printed circuit board 200, the adhesion force between the FPCB adhesive film 230 and the base film 210 may increase.

Thus, when the flexible printed circuit board 200 is curved and attached to a first module including the display panel 100, the cover panel 110, and the panel adhesive film 120 (see, for example, the structure of FIGS. 1 to 3), after some time elapses (e.g., a predetermined amount of time elapses), the adhesion force may increase as compared to an adhesion force of a module in which the FPCB adhesive film of the flexible printed circuit board is directly attached to the cover panel.

Figure 6:
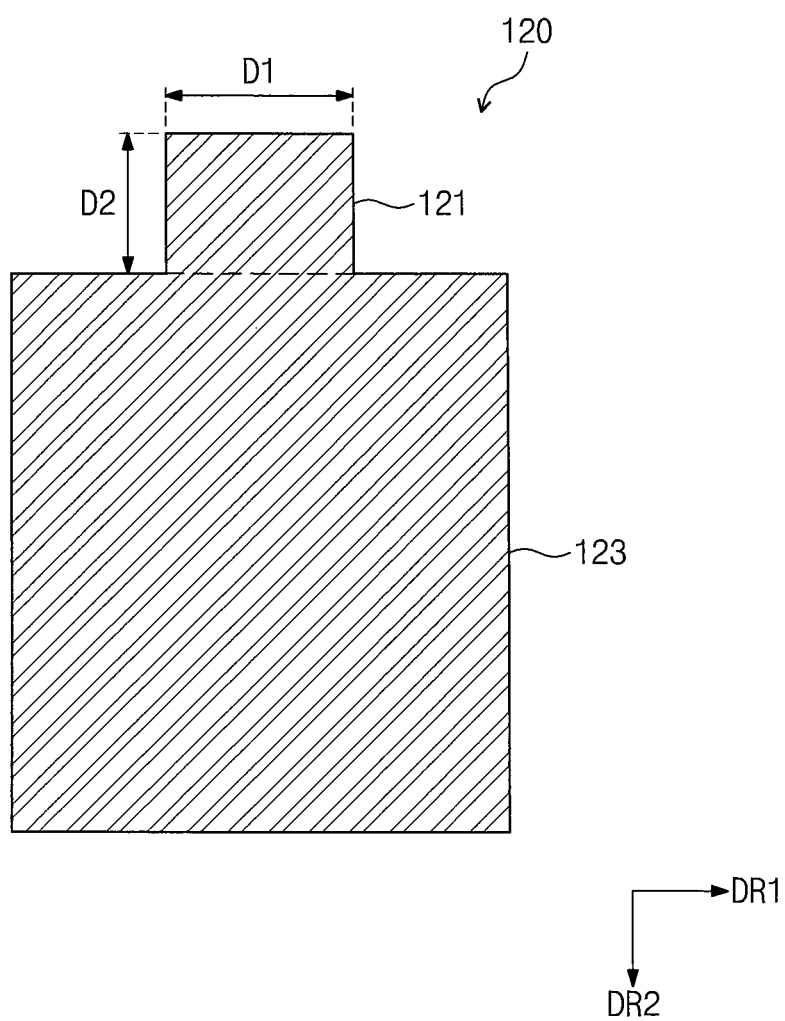
FIG. 6 is a plan view of a panel adhesive film according to one or more exemplary embodiments of the present invention.

FIG. 6 is a plan view of the panel adhesive film 120 according to one or more exemplary embodiments of the present invention.

Referring to FIGS. 2, 3, 4, and 6, the panel adhesive film 120 may include a first panel adhesive film 121 and a second panel adhesive film 123.

The first panel adhesive film 121 adheres to the flexible printed circuit board 200, and the second panel adhesive film 123 adheres to the main printed circuit board 300.

The first panel adhesive film 121 may have an area that is substantially the same as that within an outer periphery of the FPCB adhesive film 230 on the plane. The first panel adhesive film 121 may overlap the integrated circuit chip 220 in the assembled state.

The first panel adhesive film 121 may have a length D1 in the first direction DR1 that is substantially the same as a length W1 of the FPCB adhesive film 230 in the first direction DR1 (within a tolerance). The first panel adhesive film 121 may have a length D2 in the second direction DR2 that is substantially the same as a length W2 of the FPCB adhesive film 230 in the second direction DR2 (within a tolerance).

The second panel adhesive film 123 may have a length in the first direction DR1 that is substantially the same as a length of the main printed circuit board 300 in the first direction DR1 (within a tolerance). The second panel adhesive film 123 may have a length in the second direction DR2 that is substantially the same as a length of the main printed circuit board 300 in the second direction DR2 (within a tolerance).

Figure 7:
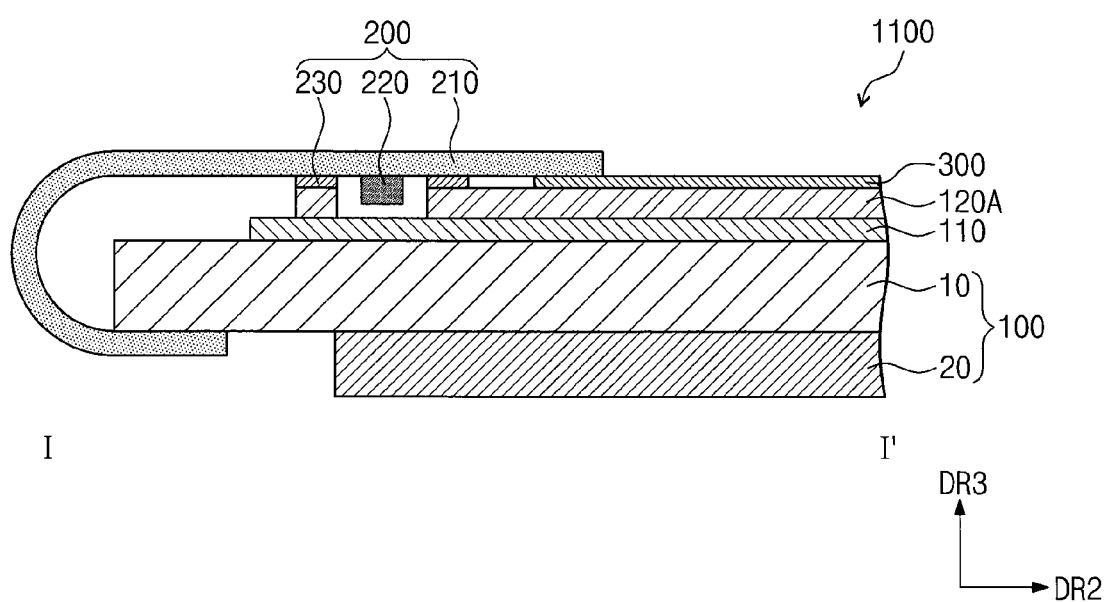
FIG. 7 is a cross-sectional view taken along the line I-I' of FIG. 1 of a display apparatus according to one or more exemplary embodiments of the present invention.
Figure 8:
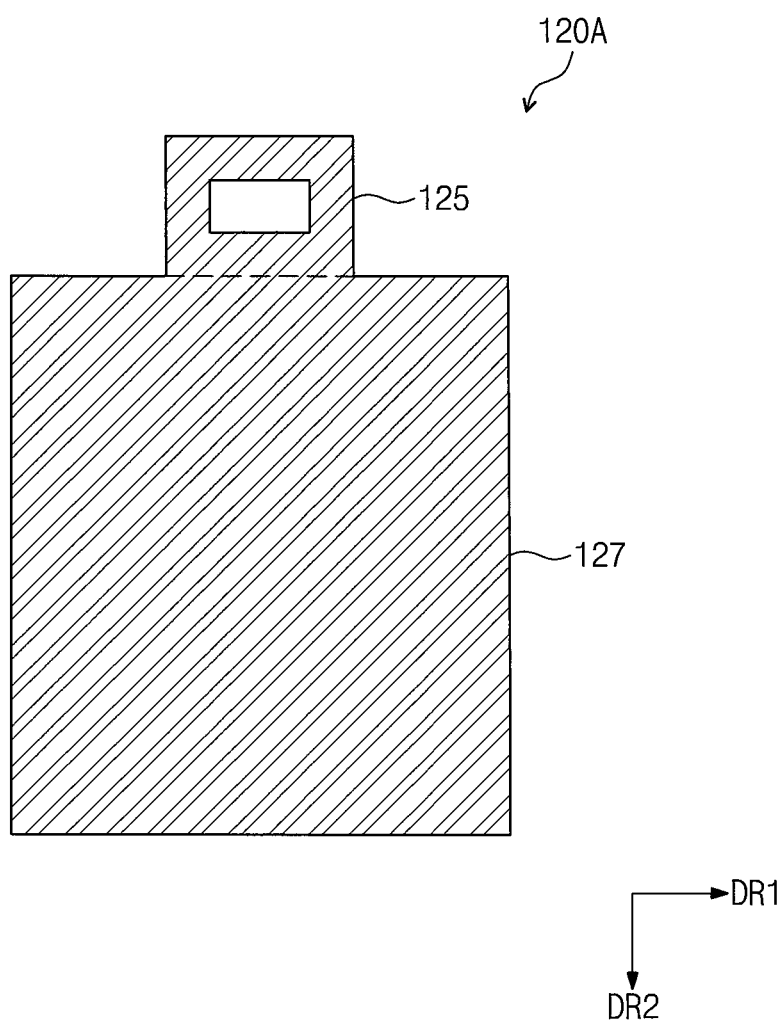
FIG. 8 is a plan view of a panel adhesive film according to the display apparatus of FIG. 7.

FIG. 7 is a cross-sectional view of the display apparatus 1100 taken along the line I-I' of FIG. 1, according to one or more exemplary embodiments of the present invention, and FIG. 8 is a plan view of a panel adhesive film 120A of the display apparatus 1100 of FIG. 7.

Referring to FIGS. 4, 7, and 8, a panel adhesive film 120A may include a first panel adhesive film 125 and a second panel adhesive film 127.

The first panel adhesive film 125 adheres to the flexible printed circuit board 200, and the second panel adhesive film 127 adheres to the main printed circuit board 300.

The first panel adhesive film 125 may have a shape that is substantially the same as a shape of an FPCB adhesive film 230 in a plan view. The first panel adhesive film 125 and an integrated circuit chip 220 may not overlap in an assembled state. Thus, the integrated circuit chip 220 may directly face a cover panel 110.

According to the display apparatus 1100, illustrated in FIGS. 7 and 8, because the panel adhesive film 120A does not overlap with the integrated circuit chip 220, the FPCB adhesive film 230 may have a thickness in the third direction DR3 that is reduced according to a thickness of the panel adhesive film 120A in the third direction DR3, and the thickness of the FPCB adhesive film 230 in the third direction DR3 of the display apparatus 1100 may be less than a thickness of the FPCB 230 in the third direction DR3 of the display apparatus 1000, as illustrated in FIGS. 3 and 6.

Figure 9:
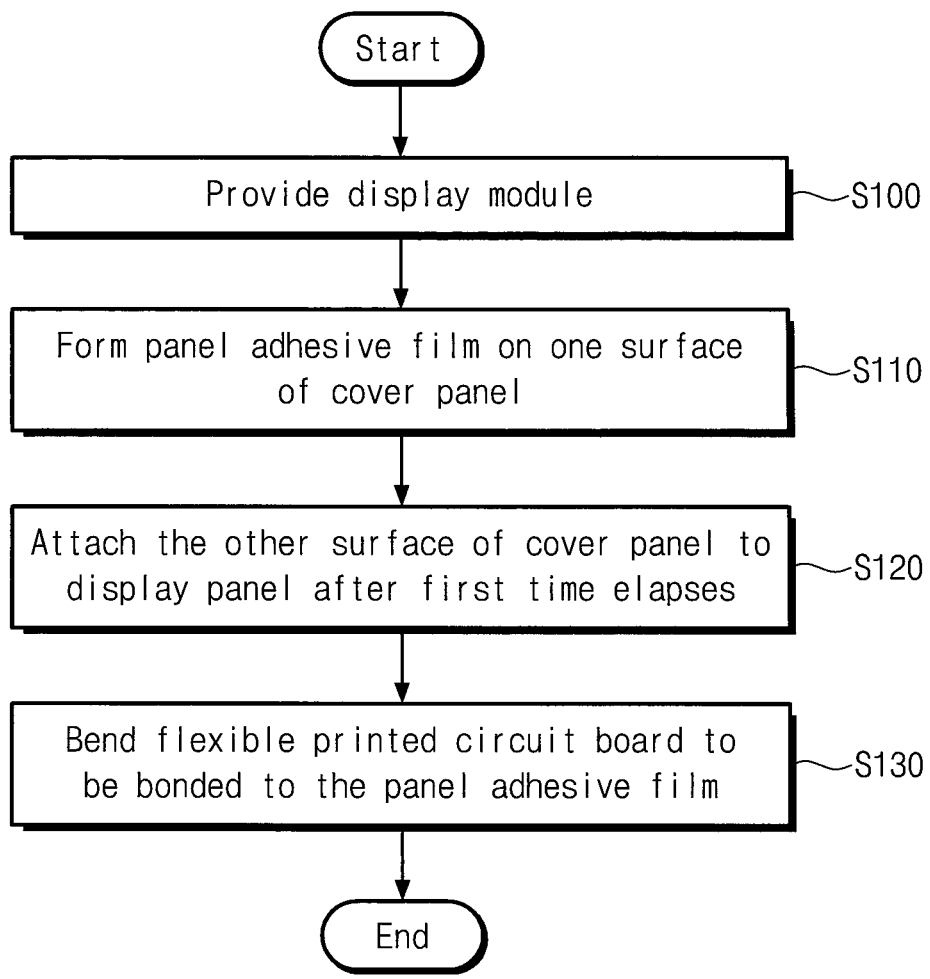
FIG. 9 is a flowchart illustrating a method for manufacturing a display apparatus according to one or more exemplary embodiments of the present invention.

FIG. 9 is a flowchart illustrating a method for manufacturing a display apparatus according to one or more exemplary embodiments of the present invention.

Referring to FIGS. 1 to 3 and 9, according to an operation S100, a display module is provided. The display module may include a display panel 100, a flexible printed circuit board 200, and a main printed circuit board 300. The flexible printed circuit board 200 may have one end (e.g., a first end) bonded to the display panel 100 and the other end (e.g., a second end) bonded to the main printed circuit board 300. Additional description of the display panel 100, the flexible printed circuit board 200, and the main printed circuit board 300 is omitted.

According to an operation S110, the panel adhesive film 120 is formed on one surface (e.g., a first surface or a bottom surface) of the cover panel 110. Here, the panel adhesive film 120 may have any suitable shape such that it is capable of adhering to the FPCB adhesive film in an assembled state.

According to an operation S120, the other surface (e.g., a second surface or a top surface opposite to the first surface) of the cover panel 110 is attached to the display panel 100 after an elapse of time, for example, after a first amount of time elapses after the panel adhesive film 120 is formed on the first surface of the cover panel 110. The first amount of time may be five days or more. In other words, the second surface of the cover panel 110 may be attached to the display panel 100 after five days or more have elapsed, according to the operation S120. Referring to FIG. 5, the panel adhesive film 120 may have an adhesion force that increases after at least five days have elapsed. When the first amount of time elapses, the adhesion force between the cover panel 110 and the panel adhesive film 120 may increase.

According to an operation S130, the flexible printed circuit board 200 is curved and adhered to the panel adhesive film 120. Here, the FPCB adhesive film 230 may adhere to the panel adhesive film 120.

According to the display apparatus and the method for manufacturing the same according to one or more exemplary embodiments of the present invention, the flexible printed circuit board may firmly adhere to the display panel to prevent or substantially prevent the peel-off phenomenon from occurring.

The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, it will be understood by those of ordinary skill in the art that various changes in form and details may be made without departing from the spirit and scope of the present disclosure as set forth in the following claims and their equivalents.

What is claimed is:
1. A display apparatus comprising:
a display panel configured to display an image;
a panel adhesive film on the display panel;
a main printed circuit board having circuits for driving the display panel thereon, the main printed circuit board being adhered to the panel adhesive film in an assembled state; and
a flexible printed circuit board electrically connecting the display panel to the main printed circuit board,
wherein the flexible printed circuit board comprises:
a base film having a bonding area that is bonded to the display panel and the main printed circuit board and a non-bonding area that is not bonded to the display panel and the main printed circuit board;
an integrated circuit chip on the base film and overlapping with the non-bonding area; and
an FPCB adhesive film on the base film and overlapping with the non-bonding area, the FPCB adhesive film and the panel adhesive film being adhered to each other in the assembled state, and
wherein the panel adhesive film comprises:
a first panel adhesive film adhered to the flexible printed circuit board, the first panel adhesive film having an area that is substantially the same as that within an outer periphery of the FPCB adhesive film in a plan view; and
a second panel adhesive film adhered to the main printed circuit board.
2. The display apparatus of claim 1, wherein the FPCB adhesive film surrounds the integrated circuit chip in a plane.
3. The display apparatus of claim 1, wherein the first panel adhesive film overlaps with the integrated circuit chip in the assembled state.

4. The display apparatus of claim 1, further comprising a cover panel between the display panel and the panel adhesive film, the cover panel being configured to protect the display panel from an external shock.

5. The display apparatus of claim 4, wherein the cover panel comprises a porous material.

6. The display apparatus of claim 4, wherein the cover panel comprises at least one of polyurethane, polyethylene, and polyacryl.

7. The display apparatus of claim 1, wherein the display panel is flexible.

8. The display apparatus of claim 1, wherein the display panel is an organic light emitting display panel.

9. A display apparatus comprising:
a display panel configured to display an image;
a panel adhesive film on the display panel;
a main printed circuit board having circuits for driving the display panel thereon, the main printed circuit board being adhered to the panel adhesive film in an assembled state; and
a flexible printed circuit board electrically connecting the display panel to the main printed circuit board,
wherein the flexible printed circuit board comprises:
a base film having a bonding area that is bonded to the display panel and the main printed circuit board and a non-bonding area that is not bonded to the display panel and the main printed circuit board;
an integrated circuit chip on the base film and overlapping with the non-bonding area; and
an FPCB adhesive film on the base film and overlapping with the non-bonding area, the FPCB adhesive film and the panel adhesive film being adhered to each other in the assembled state, and
wherein the panel adhesive film comprises:
a first panel adhesive film adhered to the flexible printed circuit board, the first panel adhesive film has having substantially the same shape as the FPCB adhesive film in a plan view; and
a second panel adhesive film adhered to the main printed circuit board.

10. The display apparatus of claim 9, wherein the first panel adhesive film does not overlap with the integrated circuit chip in the assembled state.

* * * * *